(12) United States Patent
Nozaki et al.

(10) Patent No.: US 8,040,147 B2
(45) Date of Patent: Oct. 18, 2011

(54) PROBE CARD CASSETTE AND PROBE CARD

(75) Inventors: Shiro Nozaki, Osaka (JP); Takashi Ohtori, Osaka (JP); Kenichi Tsunogaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/878,554

(22) Filed: Sep. 9, 2010

(65) Prior Publication Data

US 2011/0006798 A1    Jan. 13, 2011

Related U.S. Application Data

(62) Division of application No. 11/995,081, filed as application No. PCT/JP2007/064439 on Jul. 23, 2007.

(30) Foreign Application Priority Data

Aug. 9, 2006 (JP) .................................. 2006-217226

(51) Int. Cl.
*G01R 31/00* (2006.01)

(52) U.S. Cl. ............................. 324/750.16; 324/756.03

(58) Field of Classification Search ............. 324/750.16, 324/756.03
See application file for complete search history.

(56) References Cited

U.S. PATENT DOCUMENTS

| 6,838,892 | B2 | 1/2005 | Suzuki |
| 7,288,954 | B2 * | 10/2007 | Kirby et al. ............. 324/750.16 |

FOREIGN PATENT DOCUMENTS

| JP | 02-052447 | 2/1990 |
| JP | 03-028772 | 2/1991 |
| JP | 06-174749 | 6/1994 |
| JP | 2005-150224 | 6/2005 |

* cited by examiner

*Primary Examiner* — Roberto Velez
(74) *Attorney, Agent, or Firm* — McDermott Will & Emery LLP

(57) ABSTRACT

A holding section (2) holds a probe card (1). Transport mechanisms (3a to 3d) have the function of transporting the probe card (1) from the holding section (2). A lock mechanism (4) is provided for the transport mechanism (3d). When the probe card cassette is placed in prober equipment, the lock mechanism (4) is released to allow the probe card (1) to be transported from the holding section (2) by the transport mechanisms (3a to 3d). When the probe card cassette is not placed in the prober equipment, the lock mechanism (4) operates to fix the probe card (1) in the holding section (2).

4 Claims, 4 Drawing Sheets

PROBE CARD CASSETTE AND PROBE CARD

RELATED APPLICATIONS

This application is a Divisional of U.S. patent application Ser. No. 11/995,081, filed on Jan. 8, 2008 now abandoned, which is a U.S. National Phase under 35 U.S.C. §371 of International Application No. PCT/JP2007/064439, filed on Jul. 23, 2007, which in turn claims the benefit of Japanese Application No. 2006-217226, filed on Aug. 9, 2006, the disclosures of which Applications are incorporated by reference herein.

TECHNICAL FIELD

The present invention relates to probe cards for use in probe tests on semiconductor integrated circuits.

BACKGROUND ART

Tests on semiconductor integrated circuits are broadly divided into tests (hereinafter referred to as "probe tests") which are performed on semiconductor integrated circuits in wafer form after completion of diffusion process and tests which are conducted on semiconductor integrated circuits as packaged products after completion of assembly process.

A probe test is performed by placing a probe card in prober equipment and bringing the probe needles of the probe card into contact with electrode pads on IC chips which are connected with an LSI tester and arranged regularly on a wafer.

FIG. 10 is a view illustrating the structure of a typical probe card. In FIG. 10, the reference numeral 101 refers to a probe card substrate, and the reference numerals 102a, 102b, . . . refer to probe needles. The numerous probe needles 102a, 102b, . . . are connected at their base ends to the probe card substrate 101, while their tip ends protrude obliquely downward. The base ends of the probe needles 102a, 102b, . . . are electrically connected to an LSI tester via the probe card substrate 101. The tip end of each of the probe needles 102a, 102b, . . . corresponds to the approximate center of an electrode pad of a semiconductor integrated circuit.

Patent Document 1 discloses a technique in which the positions and levels of all probe needles with respect to electrode pads are automatically recognized by aligning a reference position for LSI chips with a reference position in probe needle information.

Patent Document 1: Japanese Laid-Open Publication No. 2005-150224

DISCLOSURE OF THE INVENTION

Problem that the Invention Intends to Solve

The conventional probe card, however, has a structure in which the probe needles are exposed outwardly, and thus has a problem in that the probe needles may be broken due to an operator's error, dropping, or the like.

The present invention was made to address the problem with the conventional structure, and an object of the invention is to provide a probe card and a probe card cassette capable of preventing breakage of probe needles due to an operator's error, dropping, or the like.

Means for Solving the Problem

A first aspect of the invention is directed to a probe card cassette including: a holding section for holding a probe card; a transport mechanism for transporting the probe card from the holding section; and a lock mechanism for locking operation of the transport mechanism, wherein when the probe card cassette is placed in prober equipment, the lock mechanism is released to allow the probe card to be transported from the holding section by the transport mechanism, while when the probe card cassette is not placed in the prober equipment, the lock mechanism operates to fix the probe card in the holding section.

According to the first aspect of the invention, when the probe card cassette is not placed in the prober equipment, the lock mechanism operates to fix the probe card in the holding section, thereby allowing the probe needles to be protected.

A second aspect of the invention is directed to a probe card including: a probe card substrate; a probe needle whose base end is connected to one surface of the probe card substrate; and a stopper section provided in the probe card substrate and including a stopper member and a height adjustment mechanism, the stopper member protruding from the one surface and being slidable in a direction in which the stopper member protrudes, the height adjustment mechanism adjusting height of the stopper member protruding from the one surface, wherein the height adjustment mechanism is configured to be able to adjust the protruding height of the stopper member between a first height higher than the position of tip end of the probe needle and a second height lower than the position of the tip end of the probe needle.

According to the second aspect of the invention, the protruding height of the stopper member is adjustable between the first height higher than the position of the tip end of the probe needle and the second height lower than the position of the tip end of the probe needle. Thus, when no probe test is conducted, it is possible to protect the probe needle by setting the protruding height of the stopper member to the first height higher than the position of the tip end of the probe needle. On the other hand, when a probe test is conducted, the probe test can be performed by setting the protruding height of the stopper member to the second height lower than the position of the tip end of the probe needle.

The height adjustment mechanism according to the second aspect of the invention preferably includes an inlet/outlet for introducing a medium from outside the stopper section and discharging the medium to outside the stopper section, and is preferably configured so as to set the protruding height of the stopper member in accordance with the amount of the medium introduced.

The height adjustment mechanism according to the second aspect of the invention preferably includes a rotating mechanism which is controllable from outside the stopper section, and is preferably configured so as to set the protruding height of the stopper member in accordance with operation of the rotating mechanism.

Also, in the second aspect of the invention, the height adjustment mechanism is preferably configured to be able to output a signal indicating a result of height adjustment; and the probe card substrate preferably includes: a memory device for storing a result of past height adjustment or a result of height adjustment performed during fabrication; and a comparator for comparing the signal output from the height adjustment mechanism with the past height adjustment result or the result of the height adjustment performed during fabrication stored in the memory device, and if a difference therebetween exceeds a reference value, outputting a signal indicating that.

A third aspect of the invention is directed to a probe card cassette including a holding section for holding the probe card of the second aspect of the invention, wherein the height adjustment mechanism in the probe card is configured to be able to output a signal indicating a result of height adjustment; and the holding section includes: a memory device for storing a result of past height adjustment or a result of height adjustment performed during fabrication; and a comparator for comparing the signal output from the height adjustment mechanism with the past height adjustment result or the result of the height adjustment performed during fabrication stored in the memory device, and if a difference therebetween exceeds a reference value, outputting a signal indicating that.

A fourth aspect of the invention is directed to a probe card including: a probe card substrate having a hole, with a first electrode provided on one surface of the probe card substrate; and a probe needle section including a base plate and a projection protruding from the base plate, with the base end of a probe needle connected to tip end of the projection, wherein the probe card substrate and the probe needle section are connected via an elastic member, with the projection of the probe needle section inserted into the hole in the probe card substrate from the one surface side, in such a manner that the probe needle section is slidable in a direction in which the projection is inserted; on a surface with the projection protruding of the base plate of the probe needle section, a second electrode is provided to face the first electrode; when pressure is applied to the probe needle section from backside of the base plate, the elastic member contracts to cause the surface with the projection protruding of the base plate and the one surface of the probe card substrate to come into contact with each other to give an electrical connection between the first electrode and the second electrode; and when no pressure is applied to the probe needle section from backside of the base plate, the elastic member extends, such that the surface with the projection protruding of the base plate and the one surface of the probe card substrate are separated from each other and tip end of the probe needle is positioned inwardly of another surface of the probe card substrate.

According to the fourth aspect of the invention, when no probe test is conducted, no pressure is applied to the probe needle section from the backside of the base plate, which allows the elastic member to extend, such that the surface with the projection protruding of the base plate and the one surface of the probe card substrate are separated from each other and the tip end of the probe needle is positioned inwardly of another surface of the probe card substrate. That is, it is possible to protect the probe needle.

Effects of the Invention

According to the invention, when no probe test is conducted, it is possible to protect the probe needle and hence prevent breakage of the probe needle due to an operator's error, dropping, or the like.

EXPLANATION OF THE REFERENCE CHARACTERS

Figure 1:
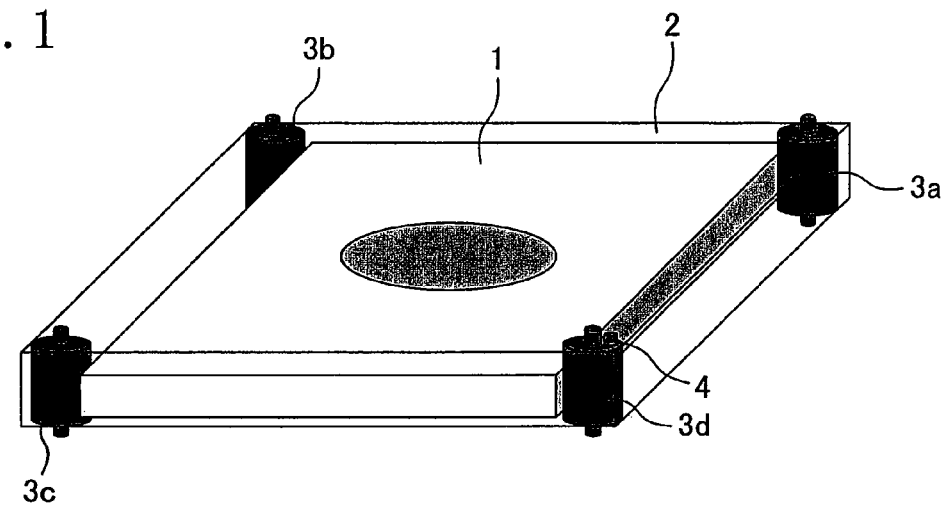
FIG. 1 is a perspective view illustrating the structure of a probe card cassette according to a first embodiment of the invention.

1 Probe card
2 Holding section
3a, 3b, 3c, 3d Transport mechanisms
4 Lock mechanism
5a Memory device
5b Comparator
101 Probe card substrate
101a Hole
102a, 102b Probe needles
103 Stopper section
103b Stopper member
103c Medium storage section
105 Elastic member
106 Inlet/outlet
107 Rotating mechanism
108 Probe needle section
108a Base plate
108b Projection
109a, 109b Second electrodes
110a, 110b First electrodes
111a, 111b Elastic members

BEST MODE FOR CARRYING OUT THE INVENTION

Hereinafter, in order to further simplify an understanding of the invention, embodiments of the invention will be described. These embodiments are only aspects of the invention and thus do not limit the invention, and any changes and modifications may be made therein within the scope of the invention.

FIG. 1 is a perspective view showing the structure of a probe card cassette according to a first embodiment of the invention. In FIG. 1, the reference numeral 1 refers to a probe card; 2 to a holding section for holding the probe card; 3a, 3b, 3c, and 3d to transport mechanisms for transporting the probe card 1 from the holding section 2 and storing the probe card 1 into the holding section 2; and 4 to a lock mechanism for locking operation of the transport mechanism 3d for prevention of improper transport of the probe card 1. While the lock mechanism 4 is operating, the probe card 1 is fixed in the holding section 2. While the lock mechanism 4 is released, the probe card 1 can be transported from the holding section 2 by the transport mechanisms 3a to 3d.

When a probe test is performed, the probe card cassette shown in FIG. 1 with the probe card 1 held thereon is placed in prober equipment. When the probe card cassette is placed in the prober equipment, the prober equipment releases the lock mechanism 4 to release the lock of the operation of the transport mechanism 3d, thereby allowing the probe card 1 to be transported by the transport mechanisms 3a to 3d from the holding section 2 into the prober equipment. Then, the prober equipment is ready to conduct the probe test.

At the completion of the probe test, the probe card 1 is transported from the prober equipment and held in the holding section 2. After the completion of the holding process, the probe card cassette is removed from the prober equipment, at which time the lock mechanism 4 is activated to fix the probe card 1 in the holding section 2. The probe needles are thus protected.

Figure 2:
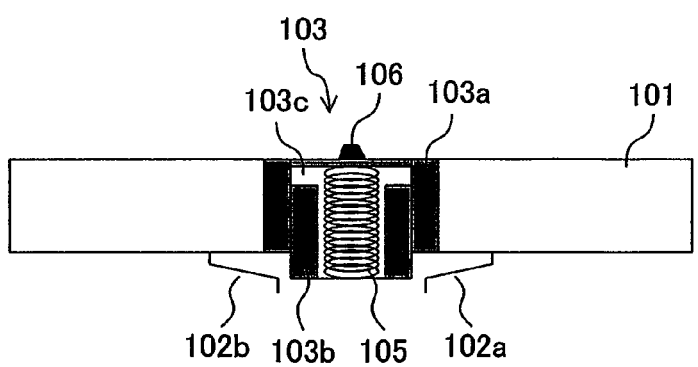
FIG. 2 is a cross-sectional view illustrating the structure of a probe card according to a second embodiment of the invention when a probe test is conducted.
Figure 3:
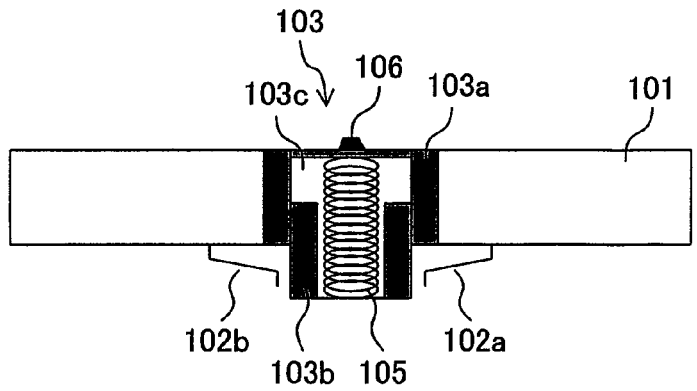
FIG. 3 is a cross-sectional view illustrating the structure of the probe card according to the second embodiment of the invention when no probe test is conducted.

FIGS. 2 and 3 are cross-sectional views illustrating the structure of a probe card according to a second embodiment of the invention. FIG. 2 shows a state in which a probe test is conducted, while FIG. 3 shows a state in which no probe test is performed. In FIGS. 2 and 3, the reference numeral 101 refers to a probe card substrate, and 102a and 102b denote probe needles, whose base ends are connected to one surface of the probe card substrate 101. The reference numeral 103 represents a stopper section provided in the probe card substrate 101. The stopper section 103 includes: a receiving section 103a which is fixed in the probe card substrate 101; a stopper member 103b which slides with respect to the receiving section 103a; an elastic member 105 which connects the receiving section 103a and the stopper member 103b and is formed of a helical spring, for example; and an inlet/outlet 106 which provides communication between a medium storage section 103c, defined and formed by the receiving section 103a and the stopper member 103b, and the outside. The stopper member 103b protrudes from the one surface of the probe card substrate 101 and is configured so as to be slidable in the protrusion direction. Through the inlet/outlet 106, a medium made of, e.g., a gas, such as air, or a liquid, such as oil, can be introduced into the medium storage section 103c from outside the stopper section 103 and can be discharged from the medium storage section 103c to outside the stopper section 103.

Introducing a medium into the medium storage section 103c through the inlet/outlet 106 causes the elastic member 105 to extend to increase the height of the protrusion of the stopper member 103b protruding from the one surface of the probe card substrate 101. On the other hand, discharge of the medium from the medium storage section 103c through the inlet/outlet 106 causes the elastic member 105 to contract to reduce the height of the protrusion of the stopper member 103b protruding from the one surface of the probe card substrate 101. That is, the protruding height of the stopper member 103b is set by the amount of the medium introduced in the medium storage section 103c. The medium storage section 103c, the elastic member 105, and the inlet/outlet 106 form a height adjustment mechanism.

In the second embodiment, the height adjustment mechanism is configured so as to be able to adjust the protruding height of the stopper member 103b between a first height higher than the positions of the tip ends of the probe needles 102a and 102b and a second height lower than the positions of the tip ends of the probe needles 102a and 102b.

When a probe test is conducted, as shown in FIG. 2, the probe card is placed in prober equipment, followed by discharge of the medium through the inlet/outlet 106, such that the amount of the medium in the medium storage section 103c is decreased. This causes the elastic member 105 to contract to thereby reduce the height of the protrusion of the stopper member 103b protruding from the one surface of the probe card substrate 101, so that the stopper member 103b has a protruding height lower than the positions of the tip ends of the probe needles 102a and 102b, allowing the probe test to be performed. At this time, it is desired that the protruding height of the stopper member 103b be slightly lower than the positions of the tip ends of the probe needles 102a and 102b. Then, even if an operator's error occurs during the probe test, the resultant movements of the tip ends of the probe needles 102a and 102b during the probe test are minimized, thereby preventing breakage of the probe needles 102a and 102b.

When no probe test is conducted, as shown in FIG. 3, the probe card is removed from the prober equipment, at which time a medium is introduced through the inlet/outlet 106 to increase the amount of the medium in the medium storage section 103c. This causes the elastic member 105 to extend to increase the height of the protrusion of the stopper member 103b protruding from the one surface of the probe card substrate 101, such that the stopper member 103b has a protruding height higher than the positions of the tip ends of the probe needles 102a and 102b, thereby protecting the probe needles 102a and 102b. That is, it is possible to prevent breakage of the probe needles 102a and 102b.

Figure 4:
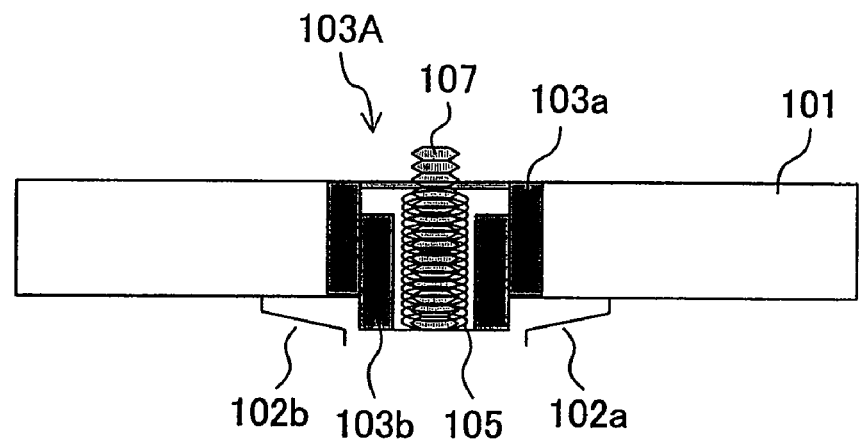
FIG. 4 is a cross-sectional view illustrating the structure of a probe card according to a third embodiment of the invention when a probe test is conducted.
Figure 5:
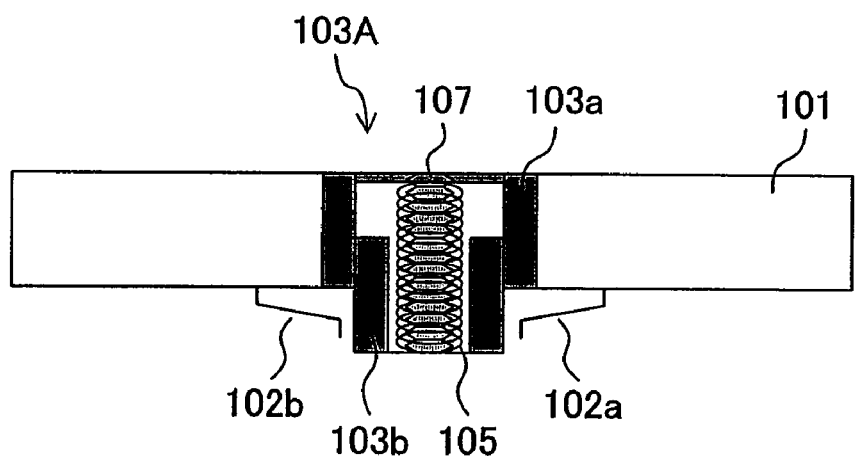
FIG. 5 is a cross-sectional view illustrating the structure of the probe card according to the third embodiment of the invention when no probe test is conducted.

FIGS. 4 and 5 are cross-sectional views illustrating the structure of a probe card according to a third embodiment of the invention. FIG. 4 shows a state in which a probe test is conducted, while FIG. 5 shows a state in which no probe test is carried out. In FIGS. 4 and 5, the same members as those shown in FIGS. 2 and 3 are identified by the same reference numerals, and detailed description thereof is omitted herein.

In the third embodiment, the protruding height of a stopper member 103b is adjusted not by introducing or discharging a medium but by operation of a rotating mechanism 107 formed of a screw, for example. To be specific, a stopper section 103A includes a receiving section 103a, the stopper member 103b, an elastic member 105, and the rotating mechanism 107. The rotating mechanism 107 is controllable from outside the stopper section 103A and is configured so as to pull up the stopper member 103b when rotated in a given direction and push down the stopper member 103b when rotated in the opposite direction. The elastic member 105 and the rotating mechanism 107 form a height adjustment mechanism.

In the third embodiment, the height adjustment mechanism is also configured so as to be able to adjust the protruding height of the stopper member 103b between a first height higher than the positions of the tip ends of probe needles 102a and 102b and a second height lower than the positions of the tip ends of the probe needles 102a and 102b.

When a probe test is conducted, as shown in FIG. 4, the probe card is placed in prober equipment, followed by rotation of the rotating mechanism 107 which causes the elastic member 105 to contract to thereby pull up the stopper member 103b. The height of the protrusion of the stopper member 103b protruding from one surface of the probe card substrate 101 is thus reduced, so that the stopper member 103b has a protruding height lower than the positions of the tip ends of the probe needles 102a and 102b, thereby allowing the probe test to be performed. At this time, it is desired that the protruding height of the stopper member 103b be slightly lower than the positions of the tip ends of the probe needles 102a and 102b. Then, even if an operator's error occurs during the probe test, the resulting movements of the tip ends of the probe needles 102a and 102b during the probe test are minimized, which prevents breakage of the probe needles 102a and 102b.

When no probe test is conducted, as shown in FIG. 5, the probe card is removed from the prober equipment, at which time the rotating mechanism 107 rotates in the opposite direction to cause the elastic member 105 to extend to thereby push down the stopper member 103b. The height of the protrusion of the stopper member 103b protruding from the one surface of the probe card substrate 101 is thus increased, such that the stopper member 103b has a protruding height higher than the positions of the tip ends of the probe needles 102a and 102b, thereby protecting the probe needles 102a and 102b. That is, it is possible to prevent breakage of the probe needles 102a and 102b.

Figure 6:
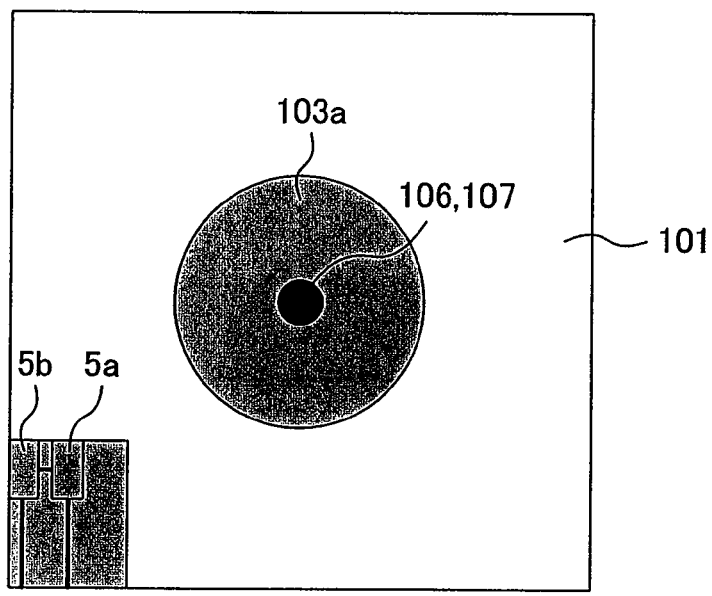
FIG. 6 is a plan view illustrating the structure of a probe card according to a fourth embodiment of the invention.

FIG. 6 is a plan view illustrating the structure of a probe card according to a fourth embodiment of the invention. The structure of the probe card shown in FIG. 6 is basically the same as those of the probe cards shown in FIGS. 2 to 5, and common members are thus identified by the same reference numerals. However, a memory device 5a and a comparator 5b are provided in an empty space in a probe card substrate 101.

In the probe card shown in FIG. 6, the above-described height adjustment mechanism is configured to be able output a signal indicating the result of height adjustment. And the memory device 5a is capable of storing the result of past height adjustment. The comparator 5b is coupled to the memory device 5a by a signal line and compares the result of the current height adjustment output from the height adjustment mechanism with the result of past height adjustment stored in the memory device 5a. And when the difference exceeds a reference value, the comparator 5b outputs a signal indicating that. When the probe card shown in FIG. 6 is placed in prober equipment, the output signal of the comparator 5b is sent to the prober equipment. This enables an indication of the occurrence of the abnormal condition.

The memory device 5a may store the result of height adjustment performed during fabrication. In that case, the same effects as those described above are also attainable.

Figure 7:
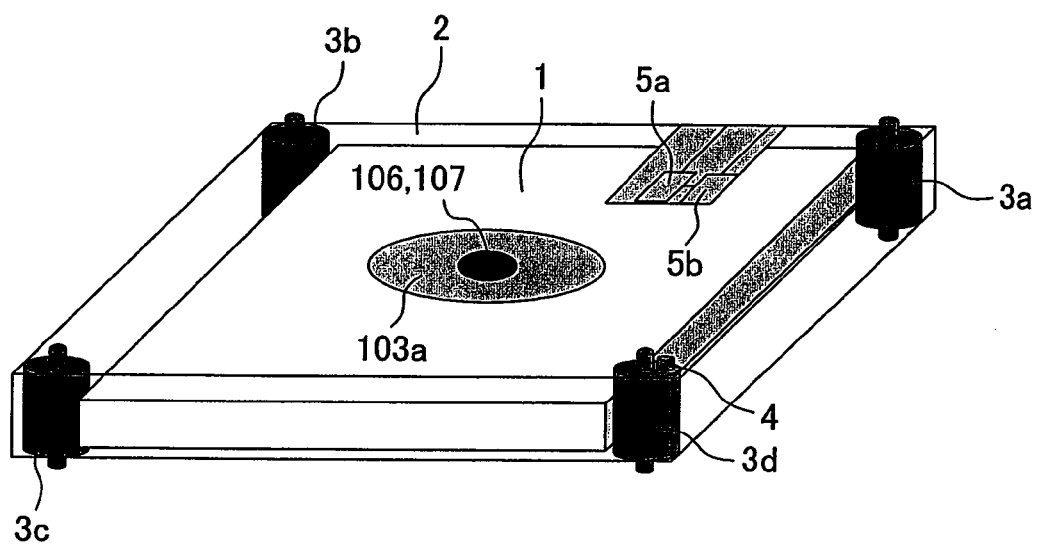
FIG. 7 is a perspective view illustrating the structure of a probe card cassette according to a fifth embodiment of the invention.

FIG. 7 is a perspective view illustrating the structure of a probe card cassette according to a fifth embodiment of the invention. The probe card cassette shown in FIG. 7 basically has the same structure as the probe card cassette shown in FIG. 1, and common members are thus identified by the same reference numerals. And the probe cards shown in FIGS. 2 to 5 are held in a holding section 2. However, a memory device 5a and a comparator 5b are provided in an empty space in a surface of the holding section 2.

In the probe cards held in the probe card cassette shown in FIG. 7, the above-described height adjustment mechanism is configured to be able to output a signal indicating the result of height adjustment. And the memory device 5a is capable of storing the result of past height adjustment. The comparator 5b is coupled to the memory device 5a by a signal line and compares the result of the current height adjustment output from the height adjustment mechanism with the result of past height adjustment stored in the memory device 5a. And when the difference exceeds a reference value, the comparator 5b outputs a signal indicating that. When the probe card cassette shown in FIG. 7 is placed in prober equipment, the output signal of the comparator 5b is sent to the prober equipment. This enables an indication of the occurrence of the abnormal condition.

The memory device 5a may store the result of height adjustment performed during fabrication. In that case, the same effects as those described above are also attainable.

Figure 8:
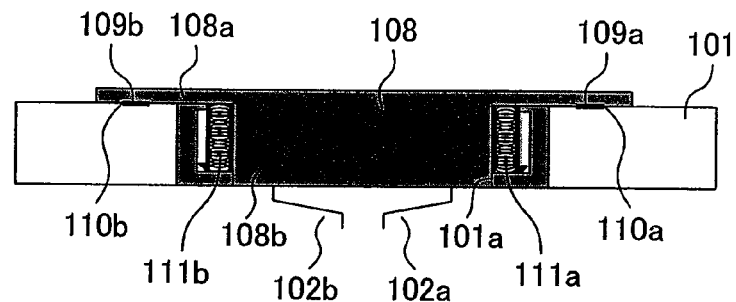
FIG. 8 is a cross-sectional view illustrating the structure of a probe card according to a sixth embodiment of the invention when a probe test is conducted.
Figure 9:
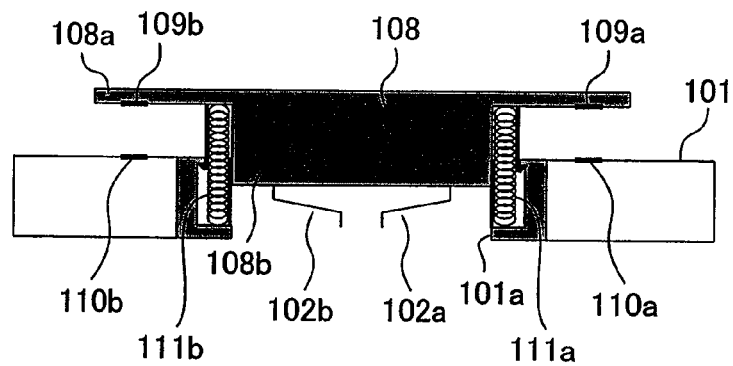
FIG. 9 is a cross-sectional view illustrating the structure of the probe card according to the sixth embodiment of the invention when no probe test is conducted.
Figure 10:
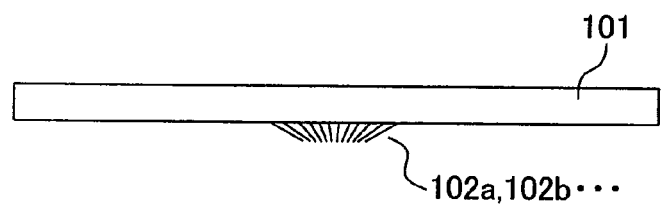
FIG. 10 is a view illustrating a typical probe card.

FIGS. 8 and 9 are cross-sectional views illustrating the structure of a probe card according to a sixth embodiment of the invention. FIG. 8 shows a state in which a probe test is conducted, while FIG. 9 shows a state in which no probe test is performed. In FIGS. 8 and 9, the reference numeral 101 denotes a probe card substrate, with first electrodes 110a and 110b provided on one surface thereof, namely the upper surface. These electrodes 110a and 110b are connected to a tester channel in the probe card substrate 101. The reference numeral 108 represents a probe needle section, which includes a base plate 108a and a projection 108b protruding from the base plate 108a. Probe needles 102a and 102b are connected at their base ends to the end of the projection 108b. The probe card substrate 101 and the probe needle section 108 are connected via elastic members 111a and 111b formed of, e.g., helical springs, with the projection 108b inserted into a hole 101a in the probe card substrate 101 from the upper surface side of the substrate 101, in such a manner that the probe needle section 108 is slidable in the insertion direction. On the surface with the projection 108b of the base plate 108a of the probe needle section 108, second electrodes 109a and 109b are provided to face the first electrodes 110a and 110b.

When a probe test is conducted, as shown in FIG. 8, the probe card is placed in prober equipment, at which time the probe card substrate 101 is fixed in the prober equipment to apply pressure to the probe needle section 108 from the backside of the base plate 108a, thereby pushing the probe needle section 108 downward. At this time, the elastic members 111a and 111b contract to cause the surface with the projection 108b of the base plate 108a and the upper surface of the probe card substrate 101 to come into contact with each other, thereby electrically connecting the first electrodes 110a and 110b and the second electrodes 109a and 109b. Also, at this time, the positions of the tip ends of the probe needles 102a and 102b are lower than the lower surface of the probe card substrate 101, which enables the probe test to be carried out.

When no probe test is conducted, as shown in FIG. 9, the probe card is removed from the prober equipment, and no pressure is applied to the probe needle section 108 from the backside of the base plate 108a. At this time, the elastic members 111a and 111b extend to push the probe needle section 108 upward, causing the surface with the projection 108b of the base plate 108a and the upper surface of the probe card substrate 101 to be separated from each other. Also, at this time, the tip ends of the probe needles 102a and 102b are positioned inwardly of the lower surface (as another surface) of the probe card substrate 101. That is, the probe needles 102a and 102b are held inside the probe card substrate 101, allowing the probe needles 102a and 102b to be protected.

INDUSTRIAL APPLICABILITY

The present invention, which enables protection of the probe needles of probe cards and thus produces the effect of preventing breakage of the probe needles due to an error, dropping, or the like, is useful in efficiently conducting probe tests, for example.

The invention claimed is:
1. A probe card comprising:
   a probe card substrate;
   a probe needle whose base end is connected to one surface of the probe card substrate; and
   a stopper section provided in the probe card substrate and including a stopper member and a height adjustment mechanism, the stopper member protruding from the one surface and being slidable in a direction in which the stopper member protrudes, the height adjustment mechanism adjusting height of the stopper member protruding from the one surface,
   wherein the height adjustment mechanism is configured to be able to adjust the protruding height of the stopper member between a first height higher than the position of tip end of the probe needle and a second height lower than the position of the tip end of the probe needle;

the height adjustment mechanism includes an inlet/outlet for introducing a medium from outside the stopper section and discharging the medium to outside the stopper section; and the height adjustment mechanism is configured so as to set the protruding height of the stopper member in accordance with the amount of the medium introduced.

2. A probe card comprising:

a probe card substrate;

a probe needle whose base end is connected to one surface of the probe card substrate; and a stopper section provided in the probe card substrate and including a stopper member and a height adjustment mechanism, the stopper member protruding from the one surface and being slidable in a direction in which the stopper member protrudes, the height adjustment mechanism adjusting height of the stopper member protruding from the one surface, wherein the height adjustment mechanism is configured to be able to adjust the protruding height of the stopper member between a first height higher than the position of tip end of the probe needle and a second height lower than the position of the tip end of the probe needle;

the height adjustment mechanism includes a rotating mechanism which is controllable from outside the stopper section; and the height adjustment mechanism is configured so as to set the protruding height of the stopper member in accordance with operation of the rotating mechanism.

3. A probe card comprising:

a probe card substrate;

a probe needle whose base end is connected to one surface of the probe card substrate; and a stopper section provided in the probe card substrate and including a stopper member and a height adjustment mechanism, the stopper member protruding from the one surface and being slidable in a direction in which the stopper member protrudes, the height adjustment mechanism adjusting height of the stopper member protruding from the one surface, wherein the height adjustment mechanism is configured to be able to adjust the protruding height of the stopper member between a first height higher than the position of tip end of the probe needle and a second height lower than the position of the tip end of the probe needle;

the height adjustment mechanism is configured to be able to output a signal indicating a result of height adjustment; and the probe card substrate includes:

a memory device for storing a result of past height adjustment or a result of height adjustment performed during fabrication; and a comparator for comparing the signal output from the height adjustment mechanism with the past height adjustment result or the result of the height adjustment performed during fabrication stored in the memory device, and if a difference therebetween exceeds a reference value, outputting a signal indicating that.

4. A probe card cassette comprising a holding section for holding a probe card, the probe card comprising:

a probe card substrate;

a probe needle whose base end is connected to one surface of the probe card substrate; and a stopper section provided in the probe card substrate and including a stopper member and a height adjustment mechanism, the stopper member protruding from the one surface and being slidable in a direction in which the stopper member protrudes, the height adjustment mechanism adjusting height of the stopper member protruding from the one surface, wherein the height adjustment mechanism is configured to be able to adjust the protruding height of the stopper member between a first height higher than the position of tip end of the probe needle and a second height lower than the position of the tip end of the probe needle, wherein the height adjustment mechanism in the probe card is configured to be able to output a signal indicating a result of height adjustment; and the holding section includes:

a memory device for storing a result of past height adjustment or a result of height adjustment performed during fabrication; and a comparator for comparing the signal output from the height adjustment mechanism with the past height adjustment result or the result of the height adjustment performed during fabrication stored in the memory device, and if a difference therebetween exceeds a reference value, outputting a signal indicating that.

* * * * *